United States Patent
Lee et al.

(10) Patent No.: US 6,686,661 B1
(45) Date of Patent: Feb. 3, 2004

(54) THIN FILM TRANSISTOR HAVING A COPPER ALLOY WIRE

(75) Inventors: Jae Gab Lee, Seoul (KR); Heung Lyul Cho, Seoul (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/686,802

(22) Filed: Oct. 12, 2000

(30) Foreign Application Priority Data

Oct. 15, 1999 (KR) ......................................... 1999-44727
Jun. 28, 2000 (KR) ................................... 10-2000-36221

(51) Int. Cl.$^7$ ............................................... H01L 23/48
(52) U.S. Cl. ........................ 257/741; 257/767; 257/771; 438/687; 438/688; 438/927
(58) Field of Search ................................ 257/741, 767, 257/771; 438/687, 688, 927

(56) References Cited

U.S. PATENT DOCUMENTS

| | | | | |
|---|---|---|---|---|
| 5,959,358 A | * | 9/1999 | Lanford et al. | 257/751 |
| 6,037,257 A | * | 3/2000 | Chiang et al. | 257/762 |
| 6,165,917 A | * | 12/2000 | Batey et al. | 257/740 |
| 6,249,055 B1 | * | 6/2001 | Dubin | 257/751 |
| 2001/0034126 A1 | * | 10/2001 | Ding et al. | 438/687 |

OTHER PUBLICATIONS

Landford et al., Low–temperature passivation of copper by doping with Al or Mg, Thin Solid Films, 262 (1995) 234–241.*

Sirringhaus et al., Self–Passivated Copper Gates for Amorphous Silicon Thin–Film Transistors, IEEE Elec. Dev. Lett., vol. 18, No. 8, (Aug. 1997) 388.*

Ding et al., Thermal annealing of buried Al barrier layers to passivate the surface of copper films, Appl. Phys. Lett., 65 (1994) 1778.*

Itow et al., Self–aligned passivation on copper interconnection durability against oxidizing ambient annealing, Appl. Phys. Lett. , 63 (1993) 934.*

Hymes et al., Passivation of copper by silicide formation in dilute silane, J. Appl. Phys., 71 (1992) 4623.*

Li et al., Oxidation and protection in copper and copper alloy thin films, J. Appl. Phys., 70 (1991) 2820.*

Lee et al., Diffusion barrier and electrical characteristics of a self–aligned MgO layer obtained from a Cu(Mg) alloy film, App. Phys. Lett., 77 (2000) 2192.*

* cited by examiner

*Primary Examiner*—Michael S. Lebentritt
*Assistant Examiner*—Christian D. Wilson
(74) *Attorney, Agent, or Firm*—Birch, Stewart, Kolasch & Birch, LLP

(57) ABSTRACT

A thin film transistor and a method of manufacturing the same includes forming a copper alloy line on substrate, an oxidation film formed on the upper surface of the copper alloy line. The copper alloy line includes a concentration y of magnesium, and the copper alloy line has a thickness t. the concentration y of magnesium in copper alloy line is related to the thickness is as follows:

$$y \leq \frac{94}{t}.$$

15 Claims, 4 Drawing Sheets

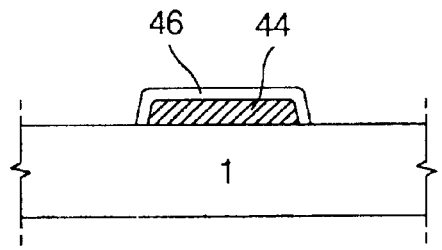
(FIG.1)
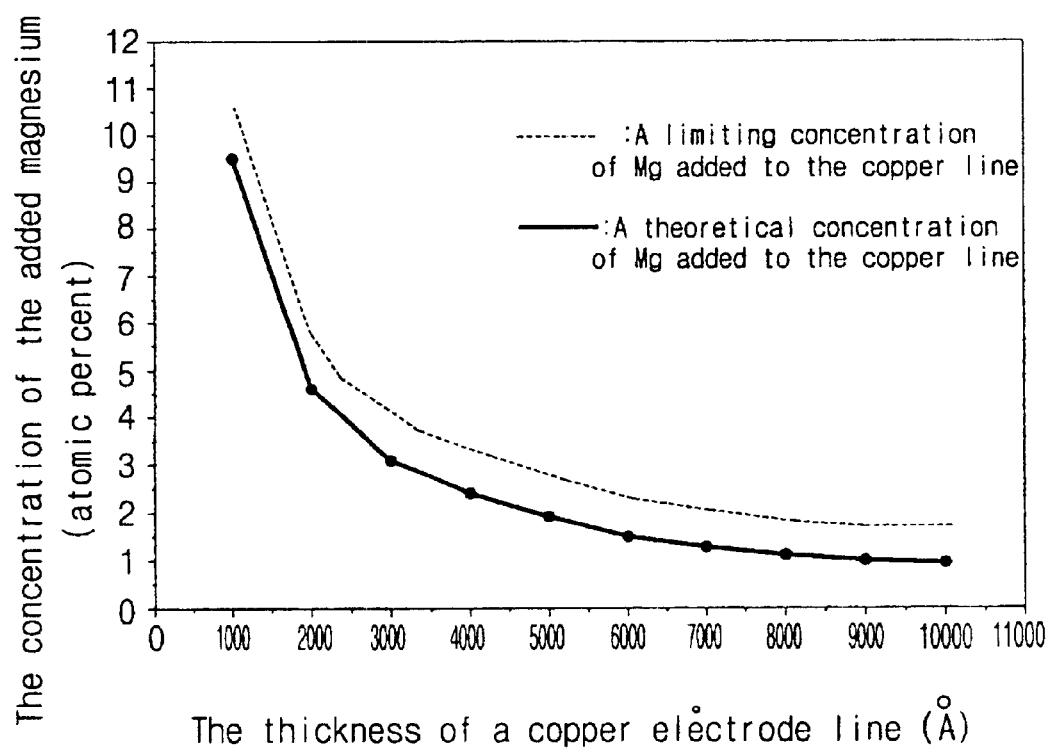
(FIG.2)

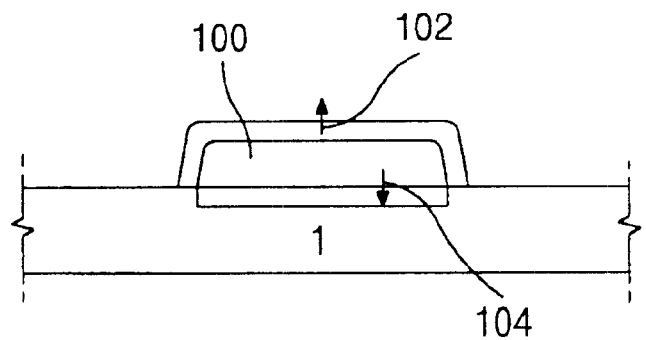
(FIG.3)
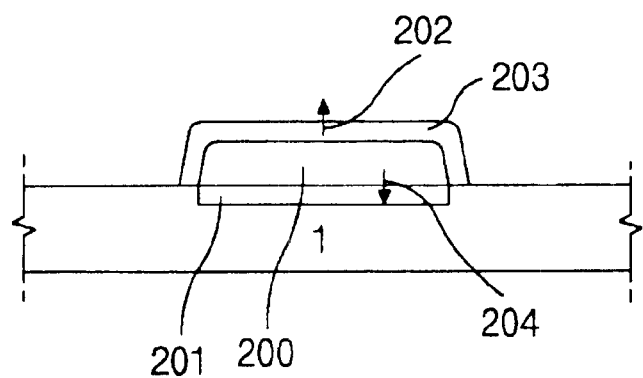
(FIG.4)

THIN FILM TRANSISTOR HAVING A COPPER ALLOY WIRE

This application claims the benefit of Korean Patent Application No. 1999–44727, filed on Oct. 15, 1999, and the benefit of Korean Patent Application No. 2000–36221, filed on Jun. 28, 2000, each of which are hereby incorporated by reference.

BACKGROUND OF THE INVENTION

1. Field of the Invention

The present invention relates to a thin film transistors (TFT) in a liquid crystal display (LCD) device. More particularly, the present invention relates to a low-resistivity gate line on LCD glass panel substrates.

2. Description of the Related Art

The length and density of bus-line conductors, such as gate lines, on large-size high-resolution LCD panels present special manufacturing problems. As LCD panels become greater in size, the bus-line conductors necessarily become longer. Forming relative long conductors on a glass substrate, such as the gate lines matrices in a bottom-gate TFT-LCD, gives rise to problems due to the resistivity of the conductive material (including signal delays and pulse distortion). Metals such as aluminum appear to be suitable for use as bus-line conductors on 18+ inch active matrix liquid crystal display (AMLCD) panels having XGA resolution or higher. Pure aluminum offers the advantage of low resistivity (approximately 3.0-$\mu\Omega$-cm) but its use as a TFT bus-line material on a glass substrate presents practical problems.

One problem with using pure aluminum for the gate line in an LCD is the formation of undesirable surface features, known as hillocks, when the deposited aluminum is heated above 200° C. during processing. Hillocks are formed because of the mismatch in the thermal expansion coefficient between the glass and the metal conductor. Stresses in the aluminum are released as hillocks when the substrate and metal are heated. Hillocks are a major impediment to the use of aluminum lines on glass substrates because in certain TFT architectures the aluminum conductors must be covered with a layer of insulating material, for example, a gate insulating layer. Deposition of the gate insulating layer involves processes which require the substrate to be heated above the aluminum yielding point (150° C.–200° C.), and, it is at such temperatures that hillocks are formed. Manufacturing yields suffer because hillocks cause shorts across conductors and thus the manufactured devices are defective.

A conventional approach to prevent hillocks from forming is to form bus lines out of aluminum alloys instead of pure aluminum. Alloys made of aluminum and tantalum (Ta), neodymium (Nd), zirconium (Zr), copper (Cu) and tungsten/molybdenum (W/Mo) all are less likely to form hillocks at conventional process temperatures when compared to pure Al. However, such alloys do not have the low resistivity of pure aluminum. They also present handling problems during deposition and have performance problems due to the non-uniform distribution of the constituent metals.

Another approach to limit the formation of hillocks is to cap pure aluminum with a layer of a suitable metal such as titanium (Ti). Capping greatly reduces the formation of hillocks and is also effective against corrosion. However, capping includes significant disadvantages because of the additional process steps involved, which increase the costs and lowers manufacturing yields.

SUMMARY OF THE INVENTION

To overcome the problems described above, preferred embodiments of the present invention provide a thin film transistor and a method of manufacturing the same in which the gate line has a simple structure and excellent electrical characteristics.

A preferred embodiment of the present invention is a thin film transistor device including a substrate, a copper alloy line on the substrate. The copper alloy line has an oxidation film on the upper surface of the copper alloy line. The copper alloy line includes magnesium of y concentration and which has a thickness t. The concentration of magnesium in the copper alloy line in relation to the thickness is $$y \le \frac{94}{t}.$$

The concentration of magnesium is about 4.5 atomic percent. The oxidation film is magnesium oxide (MgO). The oxidation film has a thickness of about 150 Å. The copper alloy line further includes aluminum. The concentration of aluminum contained in the copper alloy line is about 2.0 atomic percent and the concentration of magnesium is about 4.5 atomic percent. The substrate also includes silicon. The thin film transistor device further includes aluminum oxide ($Al_2O_3$) located at an interface between the substrate and the copper alloy line.

In another preferred embodiment of the present invention, a method of manufacturing a thin film transistor device includes the steps of providing a substrate, and forming a copper alloy line on the substrate. The copper alloy line includes a concentration y of magnesium, and the copper alloy line has a thickness t, wherein the concentration y of magnesium in relation to the thickness t of the copper alloy line is $$y \le \frac{94}{t}$$

The method also includes heat-treating the copper alloy line in an oxygen ($O_2$) atmosphere.

The heat-treatment is carried out at a temperature in the range of about 250° C. to about 500° C. and in a vacuum in the range of about 5 mTorr to about 5 Torr. Preferably, the heat-treatment is carried out at a temperature of about 350° C. and in a vacuum of about 10 mTorr. The method further includes the step of heat-treating the copper alloy line using Ar plasma. The temperature during the Ar plasma heat treatment is about 100° C.

In another preferred embodiment of the present invention a thin film transistor includes a substrate, and a gate electrode made of copper alloy on the substrate. The gate electrode includes a concentration y of magnesium, and the gate electrode has a thickness t, wherein the concentration y of magnesium in relation to the thickness is $$y \le \frac{94}{t}$$

Also provided in a gate insulating layer made of magnesium oxide on the upper surface of the gate electrode, an active layer on the gate insulating layer, an ohmic contact layer on the active layer, and source and drain electrodes on the ohmic contact layer.

The gate insulating layer has a thickness of about 150 Å. The TFT further includes a silicon nitride (SiNx) layer located between the gate insulating layer and the active layer.

In another preferred embodiment of the present invention, a method of manufacturing a thin film transistor, includes the steps of providing a substrate, and forming a gate electrode made of copper alloy on the substrate. The gate electrode has a thickness t, and the gate electrode includes a concentration y of magnesium. The concentration y in relation to the thickness t is $$y \leq \frac{94}{t}$$

The method also includes heat-treating the gate electrode in an oxygen atmosphere so as to form an oxidation film on an upper surface of the gate electrode, forming an active layer on the oxidation film, forming an ohmic contact layer on the active layer, and forming source and drain electrodes on the ohmic contact layer.

Additional steps in the method includes forming a silicon nitride film between the oxidation film and the active layer. The heat-treatment is carried out at a temperature in the range of about 250° C. to about 500° C. and in a vacuum in the range of about 5mTorr to about 5 Torr. Preferably, the heat-treatment is carried out at a temperature of about 350° C. and in a vacuum of about 10 mTorr. The method can also include the step of heat-treating the gate electrode using Ar plasma. The temperature during heat-treatment using Ar plasma is about 100° C. A concentration of oxygen contained in the copper alloy line is less than about 1 atomic percent.

In another preferred embodiment of the present invention, a method of manufacturing a thin film transistor device includes the steps of providing a substance, forming a copper alloy line on the substrate, and forming an oxidation film on the upper surface of the copper alloy line. The copper alloy line includes magnesium of y concentration and having a thickness t, wherein the concentration y of magnesium in the copper alloy line in relation to the thickness t is as follows:

$$y \leq \frac{94}{t}.$$

Preferred embodiments of the present invention includes the following advantages. First, since a dense magnesium oxide structure is formed on the copper alloy gate electrode, additional process steps for the insulating layer is no longer required. Second, since copper is low in resistivity, the TFT is able to perform a high-speed switching. Third, if the gate insulating layer has a dual-layered structure of magnesium oxide and silicon nitride, more stable electrical characteristic for the TFT is obtained. Fourth, since the thickness of the silicon nitride film is reduced due to the dense magnesium oxide structure, the process time is also reduced. Finally, if the copper line is heat-treated using Ar plasma during the oxidation reaction of the copper alloy line, the temperature during the oxidation process is able to be as low as about 100°C.

Other features, elements and advantages of the present invention will be described in detail below with respect to preferred embodiments of the present invention and the attached drawings.

BRIEF DESCRIPTION OF THE DRAWINGS

The present invention will become more fully understood from the detailed description given herein below and the accompanying drawings which are given by way of illustration only, and thus do not limit the present invention and wherein:

FIG. 1 is a cross-sectional view illustrating a process for forming an oxidation film on a gate electrode of a thin film transistor according to a first preferred embodiment of the present invention;

FIG. 2 is a graph showing the relationship between the thickness of a copper electrode line and the concentration of magnesium according to the first preferred embodiment of the present invention;

FIG. 3 is a cross-sectional view illustrating the copper electrode line and an oxidation film when the concentration of magnesium is excessive compared to the thickness of the copper line;

FIG. 4 is a cross-sectional view illustrating metal oxidation reaction according to a second preferred embodiment of the present invention;

DETAILED DESCRIPTION OF PREFERRED EMBODIMENTS

Figure 5A:
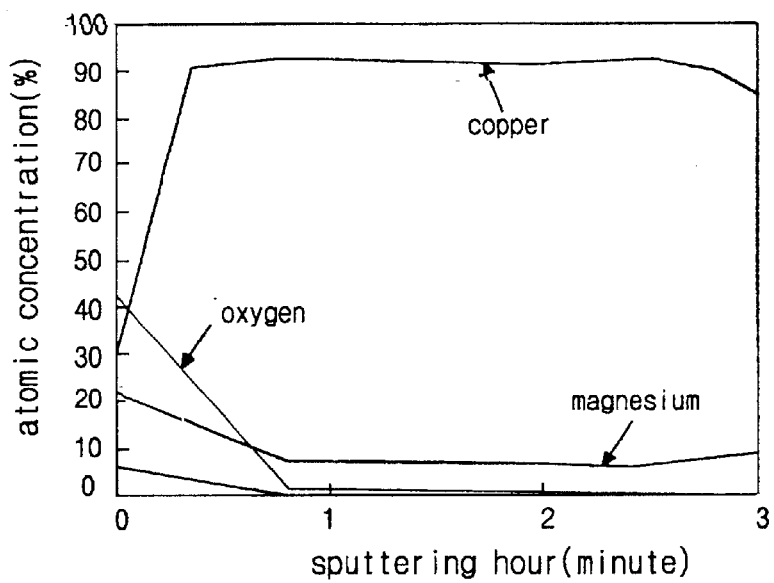
FIG. 5A is a graph illustrating a relationship between an atomic concentration and a sputtering hour when an amount of oxygen is about 0.5 atomic percent.

Table 1 shows the characteristics of a various materials which are used in a gate line.

TABLE 1

Characteristics of a various materials for a gate line

| Metal | Resistivity | Price | Adhesion | Heat-resistance |
|---|---|---|---|---|
| Cu | 2 | Good | Bad | Good |
| Au | 3 | Bad | Bad | Good |
| Al | 4 | Good | Good | Bad |
| Mo | 20 | Medium | Good | Good |
| Cr | 50 | Medium | Good | Good |

Of the various materials shown in Table 1, Al or Cr is usually used for the gate line in a conventional LCD device. Al has a good resistive and adhesive characteristics, but has bad heat resistance.

Preferred embodiments of the present invention use Cu of the gate line due to its low resistivity. However, Cu is easily oxidizable and has bad adhesive characteristics.

To overcome the disadvantages of using Cu, in a first preferred embodiment of the present invention, a predetermined amount of Mg is added to pure copper so as to form MgO on the upper and lower surfaces of the copper line, whereby an oxidation of the copper electrode line is prevented and adhesion between the copper line and the substrate is improved.

FIG. 1 is a cross-sectional view illustrating a copper gate line according to a first embodiment of the present invention. Referring to FIG. 1, the LCD panel includes a substrate 1, a copper line 44 on the substrate 1, and an oxidation film 46 on the copper line 44. The copper line 44 contains a predetermined amount of Mg.

A method for forming the oxidation film 46 is as follows. Copper containing a predetermined amount of Mg is deposited and patterned in order to form a copper line 44. Thereafter, oxidation of the copper line 44 is carried out at a temperature between about 250° C. to about 550° C. in a PVD chamber having 02 pressure preferably in the range of about 5 mTorr to about 5 Torr. Preferably, the thickness of MgO of the oxidation film 46 is less than about 150 Å. Preferably, the temperature and $O_2$ pressure are about 350° C. and about 10 mTorr, respectively. If the copper line 44 is heat-treated by Ar plasma before the oxidation process, the processing temperature during the oxidation process is preferably lowered to about 100° C.

At about this time, breakdown field is in the range of about 2 to about 3 MV/cm at bias voltages about 3 V to about 5 V and where leakage current is about $10^{-7} A/cm^2$. Therefore, the oxidation film 46 made from MgO has much better electrical characteristics than other conventional oxidation films. Further, the amount of Mg that is added to the copper line 44 depends on the thickness of the copper line 44. Namely, the amount of Mg can be calculated by the following equations.

$$N_1 = \frac{N_A \times \rho_{MgO}}{A_{MgO}} \quad \text{Equation 1}$$

$$N_2 = \frac{N_A \times \rho_{Cu}}{A_{Cu}} \quad \text{Equation 2.}$$

$N_1$ is the number of MgO per unit volume, $N_A$ is Avagadro's number ($6.023 \times 10^{23}$ atom/mol), $\rho MgO$ is the density of MgO (3.58 g/cm³), $A_{MgO}$ is the atomic weight of MgO (40.3 g/mol), N2 is the number of Cu per unit volume (8.96 g/cm³), and $A_{Cu}$ is the atomic weight of Cu (63.55 g/mol).

In order to form magnesium oxide via diffusion and such that it has a thickness of about 150 Å on the a surface of a copper line having t thickness, the concentration of magnesium that should be added to the copper line can be calculated from the following equations, which are based on equations 1 and 2.

The number of Mg per unit volume of MgO×a limiting thickness of MgO (about 150 Å)=the number of Cu per unit volume of Cu×the thickness "t" of the copper line×the concentration of Mg contained in the copper line. That is, $N_1 \times 150$ Å$=N_2 \times t \times y$, where y is the concentration of Mg (Equation 3). Note that the concentration of Mg, y=94/t is derived from equation 3.

FIG. 2 is a graph illustrating the concentration of Mg for adding to the copper line in relation to the thickness t of the copper line, as shown in Equation 3.

When the copper line has a thickness of 2000 Å, as shown in FIG. 2, the concentration of the added Mg is preferably about 4.5 atomic percent. As shown in FIG. 3, when the concentration of magnesium is excessive compared to the thickness of the copper line, as shown in FIG. 3, the following two reactions occur.

First, the magnesium oxide is formed at the upper portion of the copper line 100. Second, there is reaction between the magnesium and the substrate 1. The second reaction equation is as follows:

Equation 4.

As shown in Equation 4, the magnesium oxide 104 and Si atoms are formed during the second reaction. At about this time, the reduced Si atoms diffuse migrate into the copper line and causes the resistivity of the copper line to be increased. Therefore, appropriate concentrations of Mg is required when the Mg is added to the copper line.

As shown in FIG. 2, the broken line demonstrates the limiting concentration of Mg for adding to the copper line. That is, the limiting concentration of the added Mg is the concentration in which 1 atomic percent is added to the concentration of Mg, as shown in Equation 3.

Where the bus-line is made of copper, pure copper is preferably used with a predetermined amount of magnesium added to copper to form the copper alloy. Further, it is preferable to use magnesium oxide, which is formed after oxidation of the magnesium contained in the copper, as an insulating film.

As described above, since the resistivity is as low as about 2 μΩ-cm when copper is used for the bus-line, copper is preferably used to form the bus-line when the high speed switching is required. Further, when a predetermined amount of magnesium is added to the copper and the added magnesium is oxidized to form magnesium oxide to act as the insulating layer, the electrical characteristic of the TF such as the field effect mobility is improved.

The first preferred embodiment of the present invention provides a method in which the appropriate amount of magnesium is added to the copper line to form MgO. But, even though the appropriate amount of magnesium is added to the copper line, silicon may diffuse into the copper line by the reaction between the substrate and the copper line, which can lead to a high resistivity.

Therefore, a second preferred embodiment of the present invention includes a method to decrease the resistivity of the copper line when diffusion of silicon, which is provided between the substrate and the copper alloy line containing magnesium, occurs.

FIG. 4 is a cross-sectional view illustrating the metal oxide reaction according to the second preferred embodiment of the present invention. As shown in FIG. 4, there is provided a substrate 1 and a copper alloy line 200 containing Al and Mg on the substrate 1. In the second preferred embodiment, both Mg and Al are simultaneously added to the copper alloy line 200.

Oxidation between Mg and Al is explained below with reference to reaction Equation 5.

First, oxidation reaction of Mg occurs in the upward direction (arrow 202) of the copper line, and magnesium oxide 203 is formed on the upper surface of the line 200 as shown in equation 5.

Equation 5

Second, oxidation reaction of Al is one between the copper line 200 and substrate 1 and occurs in the downward direction (arrow 204) at the interface therebetween. As shown in Equation 6, aluminum oxide 201 and silicon are formed at the interface.

Equation 6

At about this time, aluminum oxide 201 serves to prevent silicon from diffusing into the copper line 200 thereby preventing an increase in the resistivity of the copper line 200. If the concentration of magnesium contained in the copper line 200 is about 4.5 atomic percent, aluminum is preferably about 2.0 atomic percent in concentration.

A third preferred embodiment of the present invention includes another method of lowering the resistivity of the copper alloy line. As described before, after depositing the copper alloy line containing magnesium on the substrate, the surface of the copper alloy line is oxidization-treated at the temperature between about 250° C. to about 500° C. in the oxygen atmosphere. The reason that the oxidization process is performed at the high temperature is to make magnesium in the copper alloy line to be rapidly spread to the surface of the copper alloy line. The oxidation film suppresses reaction between oxygen and the copper alloy line, whereby a conductivity of the copper alloy line is improved and an oxidation film of a good quality is formed. However, in order to apply such a technique to an array substrate for use in an LCD device, it is required that the oxidation process is performed at a low temperature and the copper alloy line has a high diffusion coefficient even at the low temperature.

To obtain such characteristics, in the third preferred embodiment of the present invention, a difusivity of magnesium is measured according to an amount of oxygen contained in the copper alloy line. The experiment is performed via an auger electron spectrometer (AES) analysis. The AES analysis is an analysis method that is able to measure how much a certain material is contained in the test piece of the copper alloy line using a concentration of auger electrons generated when electrons strike the test piece using a sputtering technique.

In the AES analysis according to the third preferred embodiment of the present invention, a diffusivity of magnesium is measured according to the sputtering hour, with changing an amount of oxygen contained in the test piece of the copper alloy line. At this point, a depth profile is preferably about 150 Å from the surface of the test piece of copper alloy line.

FIG. 5A is a graph illustrating a relationship between an atomic concentration of copper (Cu), oxygen (O) and magnesium (Mg) and the sputtering hour when an amount of oxygen is about 0.5 atomic percent. As shown in FIG. 5A, as the sputtering hour is long, the rate that oxygen and magnesium decreases is remarkable. In other words, an amount of oxygen and magnesium becomes decreased as it is far from the surface of the test piece of the copper alloy line. It is because a concentration of oxygen and magnesium on the surface of the copper alloy line is large due to the oxidation process, but an amount of oxygen contained inside the copper alloy line is so small that an amount of magnesium diffusing to the surface of the copper alloy line is increased.

Figure 5B:
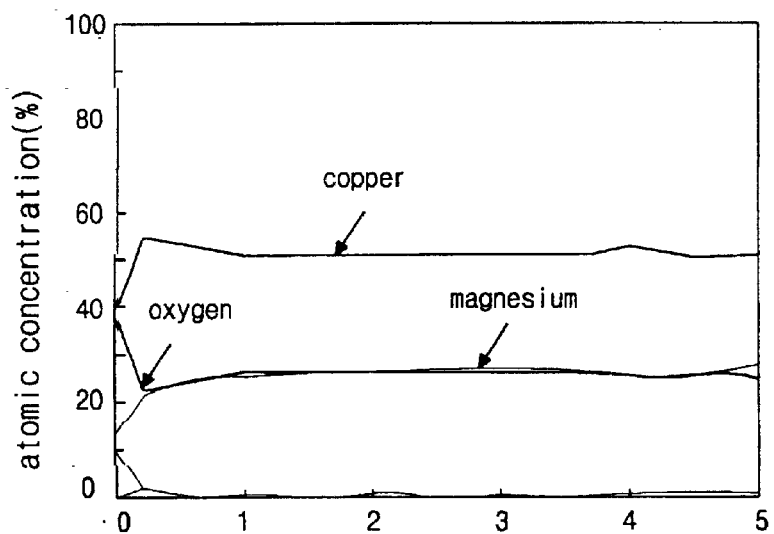
FIG. 5B is a graph illustrating a relationship between an atomic concentration and a sputtering hour when an amount of oxygen is about 20 atomic percent.

FIG. 5B is a graph illustrating a relationship between an atomic concentration of copper (Cu), oxygen (O) and magnesium (Mg) and the sputtering hour when an amount of oxygen is about 20 atomic percent. As shown in FIG. 5B, an amount of oxygen and magnesium detected in the surface and inside of the test piece is almost the same regardless of the sputtering hour. This is because when oxygen exists excessively inside the test piece of the copper alloy line, magnesium inside the copper alloy line is combined with oxygen so that a diffusion of magnesium to the surface is difficult. Therefore, a large amount of oxygen inside the copper alloy line causes oxidation, thereby increasing the resistivity of the copper alloy line.

As a result of the experiment, in order to improve the resistivity of the copper alloy line and to obtain an oxidation film of a good quality, it is preferable to reduce an amount of contained oxygen. Preferably, the copper alloy line has an amount of contained oxygen less than 1 atomic percent.

A fourth preferred embodiment of the present invention includes a TFT with reference to the first to third preferred embodiments of the present invention as described above.

Figure 6A:
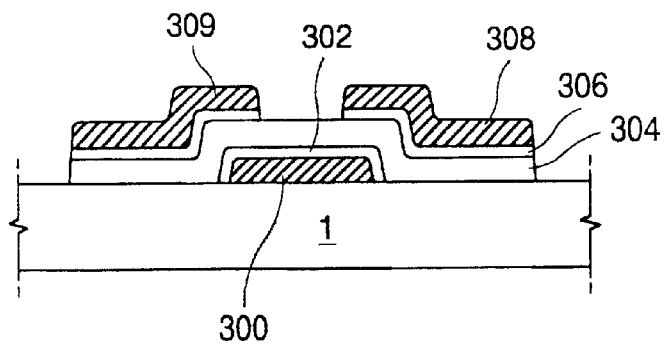
FIG. 6A is a cross-sectional view of a TFT according to a third preferred embodiment of the present invention.
Figure 6B:
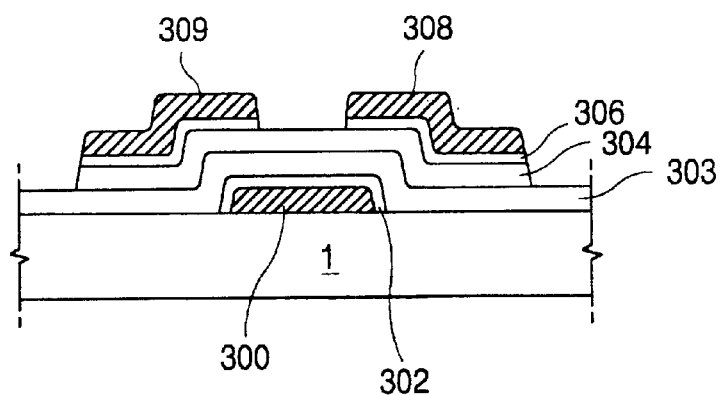
FIG. 6B is a cross-sectional views of a TFT according to the third preferred embodiment of the present invention where the TFT has been modified.

FIG. 6A is a cross-sectional view illustrating the TFT according to a third preferred embodiment of the present invention, and FIG. 6B is a cross-sectional view of the third embodiment of the present invention, where the TFT has been modified.

As shown in FIG. 6A, the TFT includes a substrate 1, a gate electrode 300 on the substrate 1, an oxidation film 304 covering the gate electrode 300, an active layer 304 on the oxidation film 302, and source and drain electrodes 309 and 308 formed over the active layer 304, respectively and separated apart from each other with the ohmic contact layer 306 interposed therebetween.

Amorphous silicon is usually used for the active layer 304, and the polycrystalline silicon is also used to improve the electrical characteristics of the TFT. The copper alloy containing magnesium is used for the gate electrode 300, and the oxidation film 302 is magnesium oxide, which is an oxygen and magnesium compound contained in the alloy. The oxidation film 302 is formed by oxidation reaction after forming the gate electrode 300. The explanation for the oxidation reaction which is described in the first embodiment is omitted.

Referring to FIG. 6B, silicon nitride (SiNx) 303 is further deposited on the oxidation film 302 in comparison to FIG. 5A to improve the electrical characteristics. More specifically, leakage current is decreased when the TFT turns to an off state. In the conventional TFT, the gate electrode is insulated by a single-layer of relatively thick insulating material, which leads to bad electrical characteristics. For example, when a voltage is applied to the gate electrode, the thick gate insulating layer decreases the field effect mobility due to the small amount of charge collected in the active layer. Further, the thick gate electrode of the conventional TFT requires a longer process.

In the TFT according to the third preferred embodiment of the present invention, since the gate insulating layer has a double-layered structure of magnesium oxide and silicon nitride it ensures better and more stable electrical characteristics for the TFT. Further, magnesium oxide having a dense molecular structure is formed on the gate electrode and a silicon nitride layer is relatively this so as to reduce the deposition process time.

Furthermore, copper having very low resistivity is preferably used for the gate electrode thereby suppressing the LCD screen from flickering due to line resistance.

The TFT of preferred embodiments has the following advantages.

First, since a dense magnesium oxide structure is preferably formed on the copper alloy gate electrode, additional process steps for the insulating layer is not required. Second, since copper is low in resistivity, the TFT can perform high speed switching. Third, if the gate insulating layer has a dual-layered structure of magnesium oxide and silicon nitride, the TFT with more stable characteristics is obtained. Fourth, since the silicon nitride film is relatively this due to the dense magnesium oxide structure, the process time is reduced. Fifth, if the copper line is heat-treated by Ar plasma during oxidation reaction of the copper alloy line, the temperature of the oxidation process can be as low as about 100° C.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A thin film transistor for a liquid crystal display device, comprising:

a substrate for the liquid crystal display device;

a heat treated copper alloy line on an upper surface of said substrate said heat treatment having been performed at temperatures between 350 and 500 degrees C.; and an oxidation film on an upper surface of said copper alloy line;

wherein said copper alloy line includes magnesium of y (atomic %) concentration and having a thickness t (Å), wherein the concentration y (atomic %) of magnesium in said copper alloy line in relation to the thickness t (Å) is as follows:

$$y \leq 94/t,$$

said line being substantially free of migrations and hillocks despite having undergone said heat treatment at temperatures between 350 and 500 degrees C.

2. The thin film transistor device of claim 1, wherein said concentration y of magnesium is about 4.5 atomic percent.

3. The thin film transistor device of claim 1, wherein said oxidation film is magnesium oxide.

4. The thin film transistor device of claim 1, wherein said oxidation film is about 150 Å in thickness.

5. The thin film transistor device of claim 1, wherein said copper alloy line further comprises aluminum.

6. The thin film transistor device of claim 5, wherein the concentration of aluminum in said copper alloy line is about 2.0 atomic percent and the concentration of magnesium is about 4.5 atomic percent.

7. The thin film transistor device of claim 5, wherein said substrate includes silicon.

8. The thin film transistor device of claim 7, further comprising aluminum oxide provided at the interface between said substrate and said copper alloy line.

9. The thin film transistor device of claim 1, wherein a concentration of oxygen contained in the copper alloy line is less than about 1 atomic percent.

10. The thin film transistor of claim 1, further comprising:

a metal oxide layer on an entire lower surface of said copper alloy line, and disposed between said copper alloy line and said substrate to prevent diffusion of silicon into said copper alloy line.

11. A thin film transistor for a liquid crystal display device, comprising:

a substrate for the liquid crystal display device;

a heat treated gate electrode made of copper alloy on an upper surface of said substrate said heat treatment having been performed at temperatures between 350 and 500 degrees C., said gate electrode including a y (atomic %) concentration of magnesium, and said gate electrode having a thickness t (Å), wherein the concentration y (atomic %) of magnesium in relation to the thickness (Å) is $$y \leq 94/t,$$

said gate electrode being substantially free of migrations and hillocks despite having undergone said heat treatment at temperatures between 350 and 500 degrees C.;

a gate insulating layer made of magnesium oxide on the upper surface of said gate electrode;

an active layer on the gate insulating layer;

an ohmic contact layer on the active layer; and source and drain electrodes on the ohmic contact layer.

12. The thin film transistor of claim 6, where said gate insulating layer has a thickness of about 150 Å.

13. The thin film transistor of claim 12, further comprising a silicon nitride layer located between said gate insulating layer and said active layer.

14. The thin film transistor of claim 11, wherein a concentration of oxygen contained in the copper alloy line is less than about 1 atomic percent.

15. The thin film transistor of claim 11, further comprising:

a metal oxide layer on an entire lower surface of said copper alloy line, and disposed between said copper alloy line and said substrate to prevent diffusion of silicon into said copper alloy line.

* * * * *